(12) United States Patent
Huang

(10) Patent No.: US 11,437,494 B2
(45) Date of Patent: Sep. 6, 2022

(54) SEMICONDUCTOR DEVICE WITH GRAPHENE-BASED ELEMENT AND METHOD FOR FABRICATING THE SAME

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/996,151

(22) Filed: Aug. 18, 2020

(65) Prior Publication Data

US 2022/0059673 A1 Feb. 24, 2022

(51) Int. Cl.
| | | |
|---|---|---|
| *H01L 29/66* | (2006.01) | |
| *H01L 29/49* | (2006.01) | |
| *H01L 29/51* | (2006.01) | |

(52) U.S. Cl.
CPC ...... *H01L 29/6656* (2013.01); *H01L 29/4916* (2013.01); *H01L 29/515* (2013.01)

(58) Field of Classification Search
None
See application file for complete search history.

(56) References Cited

U.S. PATENT DOCUMENTS

| | | | |
|---|---|---|---|
| 7,101,777 B2* | 9/2006 | Ho | H01L 21/28061 |
| | | | 257/413 |
| 2006/0220152 A1* | 10/2006 | Huang | H01L 29/6659 |
| | | | 257/408 |
| 2018/0248013 A1* | 8/2018 | Chowdhury | H01L 29/7834 |
| 2018/0342585 A1* | 11/2018 | Lu | H01L 29/72 |
| 2019/0221570 A1* | 7/2019 | Liu | H01L 23/53295 |
| 2020/0035486 A1 | 1/2020 | Venkatasubramanian et al. | |
| 2021/0050428 A1* | 2/2021 | Fukushima | H01L 29/6656 |

FOREIGN PATENT DOCUMENTS

| | | |
|---|---|---|
| TW | 427029 B | 3/2001 |
| TW | 201543537 A | 11/2015 |

* cited by examiner

*Primary Examiner* — Moin M Rahman
(74) *Attorney, Agent, or Firm* — Muncy, Geissler, Olds & Lowe, P.C.

(57) ABSTRACT

The present application discloses a semiconductor device and a method for fabricating the semiconductor device. The semiconductor device includes a substrate, a stacked gate structure positioned on the substrate; first spacers attached on two sides of the stacked gate structure; and second spacers attached on two sides of the first spacers; wherein the first spacers comprise graphene.

3 Claims, 15 Drawing Sheets

SEMICONDUCTOR DEVICE WITH GRAPHENE-BASED ELEMENT AND METHOD FOR FABRICATING THE SAME

TECHNICAL FIELD

The present disclosure relates to a semiconductor device and a method for fabricating the semiconductor device, and more particularly, to a semiconductor device with a graphene-based element and a method for fabricating the semiconductor device with the graphene-based element.

DISCUSSION OF THE BACKGROUND

Semiconductor devices are used in a variety of electronic applications, such as personal computers, cellular telephones, digital cameras, and other electronic equipment. The dimensions of semiconductor devices are continuously being scaled down to meet the increasing demand of computing ability. However, a variety of issues arise during the scaling-down process, and such issues are continuously increasing. Therefore, challenges remain in achieving improved quality, yield, performance, and reliability and reduced complexity.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate; a stacked gate structure positioned on the substrate; first spacers attached on two sides of the stacked gate structure; and second spacers attached on two sides of the first spacers; wherein the first spacers comprise graphene.

In some embodiments, the semiconductor device further comprises porous spacers positioned between the first spacers and the second spacers.

In some embodiments, the porous spacers have porosities about 30% and about 90%.

In some embodiments, the stacked gate structure comprises a dielectric layer positioned on the substrate, a bottom conductive layer positioned on the dielectric layer, a top conductive layer positioned on the bottom conductive layer, and a capping layer positioned on the top conductive layer.

In some embodiments, the stacked gate structure further comprises a first middle conductive layer positioned between the bottom conductive layer and the top conductive layer.

In some embodiments, the stacked gate structure further comprises a second middle conductive layer positioned between the first middle conductive layer and the top conductive layer.

In some embodiments, a thickness of the first middle conductive layer is about 2 nm and about 20 nm.

In some embodiments, the semiconductor device further comprises air gap spacers positioned between the first spacers and the second spacers.

Another aspect of the present disclosure provides a method for fabricating a semiconductor device, comprising: providing a substrate; forming a stacked gate structure over the substrate; forming first spacers on sidewalls of the gate stack structure, wherein the first spacers comprise graphene; forming sacrificial spacers on sidewall of the first spacers; and forming second spacers on sidewall of the sacrificial spacers.

In some embodiments, the method for preparing a semiconductor device further comprises: performing an energy treatment to turn the sacrificial spacers into porous spacers.

In some embodiments, the porous spacers have porosities about 30% and about 90%.

In some embodiments, forming a stacked gate structure over the substrate comprises: forming a dielectric layer on the substrate, forming a bottom conductive layer on the dielectric layer, forming a top conductive layer on the bottom conductive layer, forming a capping layer on the top conductive layer; and performing an etch process to form the stacked gate structure.

In some embodiments, forming a stacked gate structure over the substrate further comprises: forming a first middle conductive layer between the bottom conductive layer and the top conductive layer.

In some embodiments, forming a stacked gate structure over the substrate further comprises: forming a second middle conductive layer between the first middle conductive layer and the top conductive layer.

In some embodiments, a thickness of the first middle conductive layer is about 2 nm and about 20 nm.

In some embodiments, the method for preparing a semiconductor device further comprises: performing an energy treatment to turn the sacrificial spacers into air gap spacers between the first spacers and the second spacers.

In some embodiments, forming first spacers on sidewall of the gate stack structure comprises: forming a liner layer covering the substrate and the stacked gate structure, and performing a spacer etching process.

Another aspect of the present disclosure provides a semiconductor device including a substrate, a stacked gate structure positioned on the substrate, first spacers attached on two sides of the stacked gate structure, and second spacers attached on two sides of the first spacers. The first spacers include graphene.

In some embodiments, the semiconductor device includes porous spacers positioned between the first spacers and the second spacers.

In some embodiments, the porous spacers have porosities about 30% and about 90%.

In some embodiments, the stacked gate structure includes a dielectric layer positioned on the substrate, a bottom conductive layer positioned on the dielectric layer, a top conductive layer positioned on the bottom conductive layer, and a capping layer positioned on the top conductive layer.

In some embodiments, the stacked gate structure further includes a first middle conductive layer positioned between the bottom conductive layer and the top conductive layer.

In some embodiments, the stacked gate structure further includes a second middle conductive layer positioned between the first middle conductive layer and the top conductive layer.

In some embodiments, a thickness of the first middle conductive layer is about 2 nm and about 20 nm.

Another aspect of the present disclosure provides a method for fabricating a semiconductor device including providing a substrate, forming a first trench in the substrate, conformally forming a buried dielectric layer in the first trench, conformally forming buried covering layers to cover an upper portion of the first trench, forming a buried conductive layer on the buried dielectric layer, between the buried covering layers, and in the first trench, and forming a buried capping layer on the buried conductive layer. The buried conductive layer comprises graphene.

In some embodiments, the method for fabricating the semiconductor device includes a step of conformally forming a buried barrier layer on the buried dielectric layer and in the first trench.

In some embodiments, the buried covering layers are formed of aluminum oxide, hafnium oxide, zirconium oxide, titanium oxide, titanium nitride, tungsten nitride, silicon nitride, or silicon oxide.

Due to the design of the semiconductor device of the present disclosure, the overall cross-sectional area of the buried conductive layer may be increased by the upper portion of the buried conductive layer. Combining with the good conductivity of the buried conductive layer including graphene, the conductivity and performance of the semiconductor device may be improved. In addition, the presence of the buried covering layers may prevent void formation during fabrication of the semiconductor device. Therefore, the reliability of the semiconductor device may be improved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
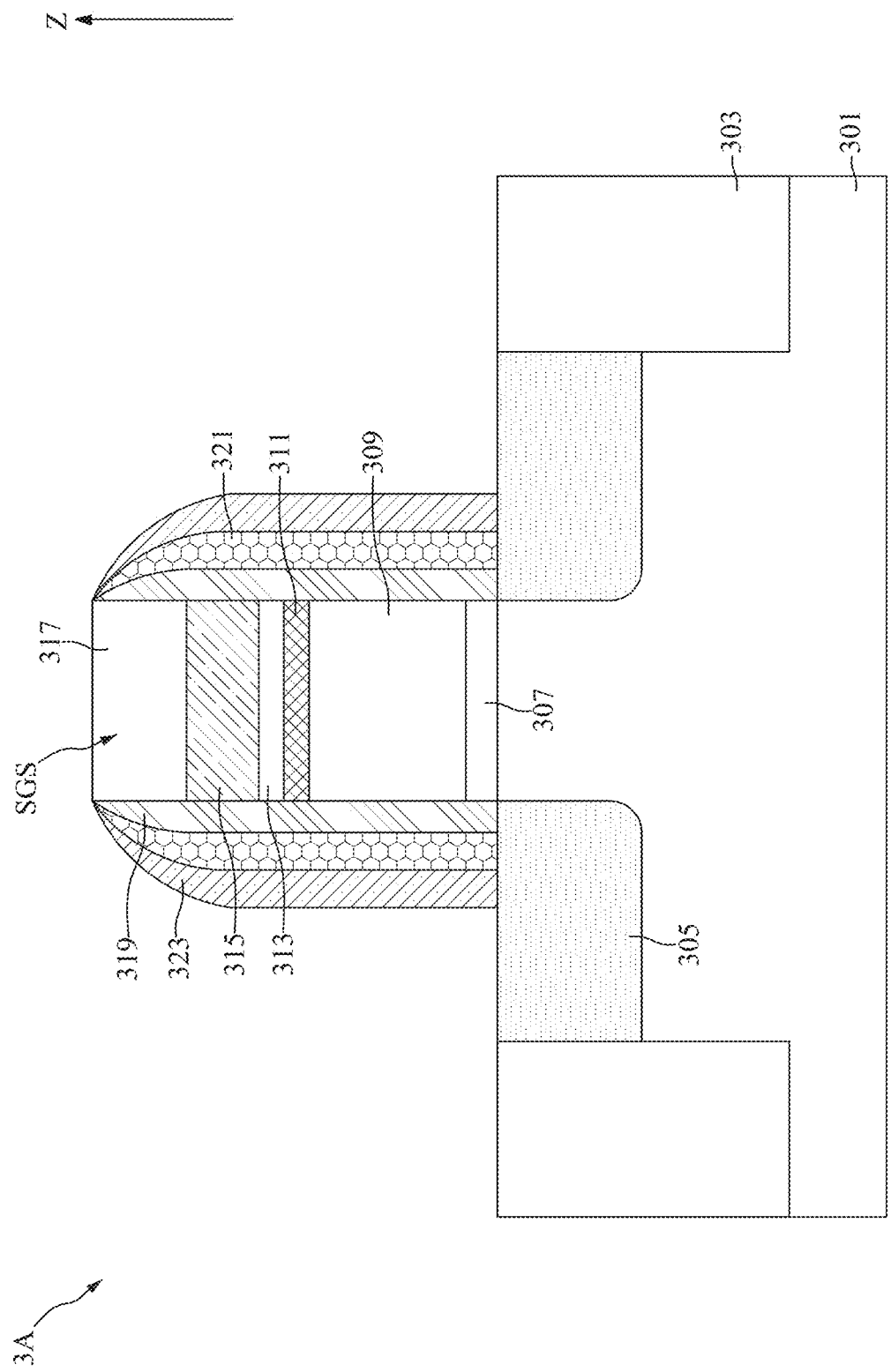
FIGS. 1 to 4 illustrate, in schematic cross-sectional view diagrams, semiconductor devices in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to" or "coupled to" another element or layer, it can be directly connected to or coupled to another element or layer, or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device.

It should be noted that, in the description of the present disclosure, above (or up) corresponds to the direction of the arrow of the direction Z, and below (or down) corresponds to the opposite direction of the arrow of the direction Z.

It should be noted that, in the description of the present disclosure, a surface of an element (or a feature) located at the highest vertical level along the direction Z is referred to as a top surface of the element (or the feature). A surface of an element (or a feature) located at the lowest vertical level along the direction Z is referred to as a bottom surface of the element (or the feature).

FIG. 1 illustrates, in a schematic cross-sectional view diagram, a semiconductor device 3A in accordance with another embodiment of the present disclosure.

With reference to FIG. 1, the semiconductor device 3A may include a substrate 301, second isolation layers 303, second source/drain regions 305, a dielectric layer 307, a bottom conductive layer 309, a first middle conductive layer 311, a second middle conductive layer 313, a top conductive layer 315, a capping layer 317, first spacers 319, porous spacers 321, and second spacers 323.

With reference to FIG. 1, the substrate 301 may be formed of a same material as the substrate 101 but is not limited thereto. The second isolation layers 303 may be disposed in the substrate 301 in a manner similar to that illustrated in FIG. 1. The second isolation layers 303 may be formed of a same material as the first isolation layers 103 but is not limited thereto.

With reference to FIG. 1, the dielectric layer 307 may be disposed on the substrate 301. In a cross-sectional perspective, the dielectric layer 307 may be line shape. The dielectric layer 307 may be formed of a same material as the buried dielectric layer 107 but is not limited thereto.

With reference to FIG. 1, the second source/drain regions 305 may be disposed adjacent to two ends of the dielectric layer 307 and disposed in the substrate 301. The second source/drain regions 305 may be doped with a dopant such as phosphorus, arsenic, antimony, or boron. The dopant concentration of the second source/drain regions 305 may have a same dopant concentration as the first source/drain regions 105 but are not limited thereto.

With reference to FIG. 1, the bottom conductive layer 309 may be disposed on the dielectric layer 307. The bottom conductive layer 309 may be formed of, for example, a conductive material such as polycrystalline silicon, polycrystalline silicon germanium, or a combination thereof. In some embodiments, the bottom conductive layer 309 may be doped with a dopant such as phosphorus, arsenic, antimony, or boron.

With reference to FIG. 1, the first middle conductive layer 311 may be disposed on the bottom conductive layer 309. The first middle conductive layer 311 may have a thickness about 2 nm and about 20 nm. The first middle conductive layer 311 may be formed of, for example, titanium silicide, nickel silicide, nickel platinum silicide, tantalum silicide, or cobalt silicide. The first middle conductive layer 311 may serve as ohmic contact and reduce the resistance between the bottom conductive layer 309 and the top conductive layer 315.

With reference to FIG. 1, the second middle conductive layer 313 may be disposed on the first middle conductive layer 311. The second middle conductive layer 313 may be formed of, for example, tungsten nitride, titanium nitride, tantalum nitride, the like, or a combination thereof. The second middle conductive layer 313 may be structured to prevent subsequent deposition processes from degrading other layers of the semiconductor device 3A. For example, some metals from the top conductive layer 315 may tend to diffuse into silicon-containing layers (e.g. the bottom conductive layer 309) during deposition and even after fabrication has completed.

With reference to FIG. 1, the top conductive layer 315 may be disposed on the second middle conductive layer 313. The top conductive layer 315 may be formed of, for example, any suitable conductor including tungsten, aluminum, copper, titanium, silver, ruthenium, molybdenum, other suitable metals and alloys thereof.

With reference to FIG. 1, the capping layer 317 may be disposed on the top conductive layer 315. The capping layer 317 may be formed of a same material as the buried capping layer 115 but is not limited thereto.

The dielectric layer 307, the bottom conductive layer 309, the first middle conductive layer 311, the second middle conductive layer 313, the top conductive layer 315, and the capping layer 317 may together form a stacked gate structure SGS.

With reference to FIG. 1, the first spacers 319 may be attached on sidewalls of the stacked gate structure SGS. The first spacers 319 may be disposed on the second source/drain regions 305. In some embodiments, the first spacers 319 may be formed of, for example, graphene. In some embodiments, the first spacers 319 may be formed of, for example, graphene, graphite, or the like. In some embodiments, the first spacers 319 may be formed of, for example, a material including $sp^2$ hybridized carbon atoms. In some embodiments, the first spacers 319 may be formed of, for example, a material including carbons having hexagonal crystal structures. The first spacers 319 formed of graphene may have low sheet resistance. Therefore, the conductivity of the semiconductor device 3A including the first spacers 319 may be improved.

With reference to FIG. 1, the porous spacers 321 may be attached on the sidewalls of the first spacers 319 and disposed on the second source/drain regions 305. The porous spacers 321 may have porosities about 30% and about 90%. The porous spacers 321 may include a skeleton and a plurality of empty spaces disposed among the skeleton. The plurality of empty spaces may connect to each other and may be filled with air. The skeleton may include, for example, silicon oxide, low-dielectric materials, or methylsilsesquioxane. The plurality of empty spaces of the porous spacers 321 may be filled with air. As a result, a dielectric constant of the porous spacers 321 may be significantly lower than a layer formed of, for example, silicon oxide. Therefore, the porous spacers 321 may significantly reduce the parasitic capacitance of the semiconductor device 3A. That is, the porous spacers 321 may significantly alleviate an interference effect between electrical signals induced or applied to the semiconductor device 3A.

With reference to FIG. 1, the second spacers 323 may be attached on sidewalls of the porous spacers 321 and disposed on the second source/drain regions 305. The second spacers 323 may be formed of, for example, silicon nitride, silicon oxide, silicon oxynitride, silicon nitride oxide, the like, or a combination thereof. The second spacers 323 may electrically insulate the stacked gate structure SGS from adjacent conductive elements and provide protection to the porous spacers 321 and the first spacers 319.

Figure 2:
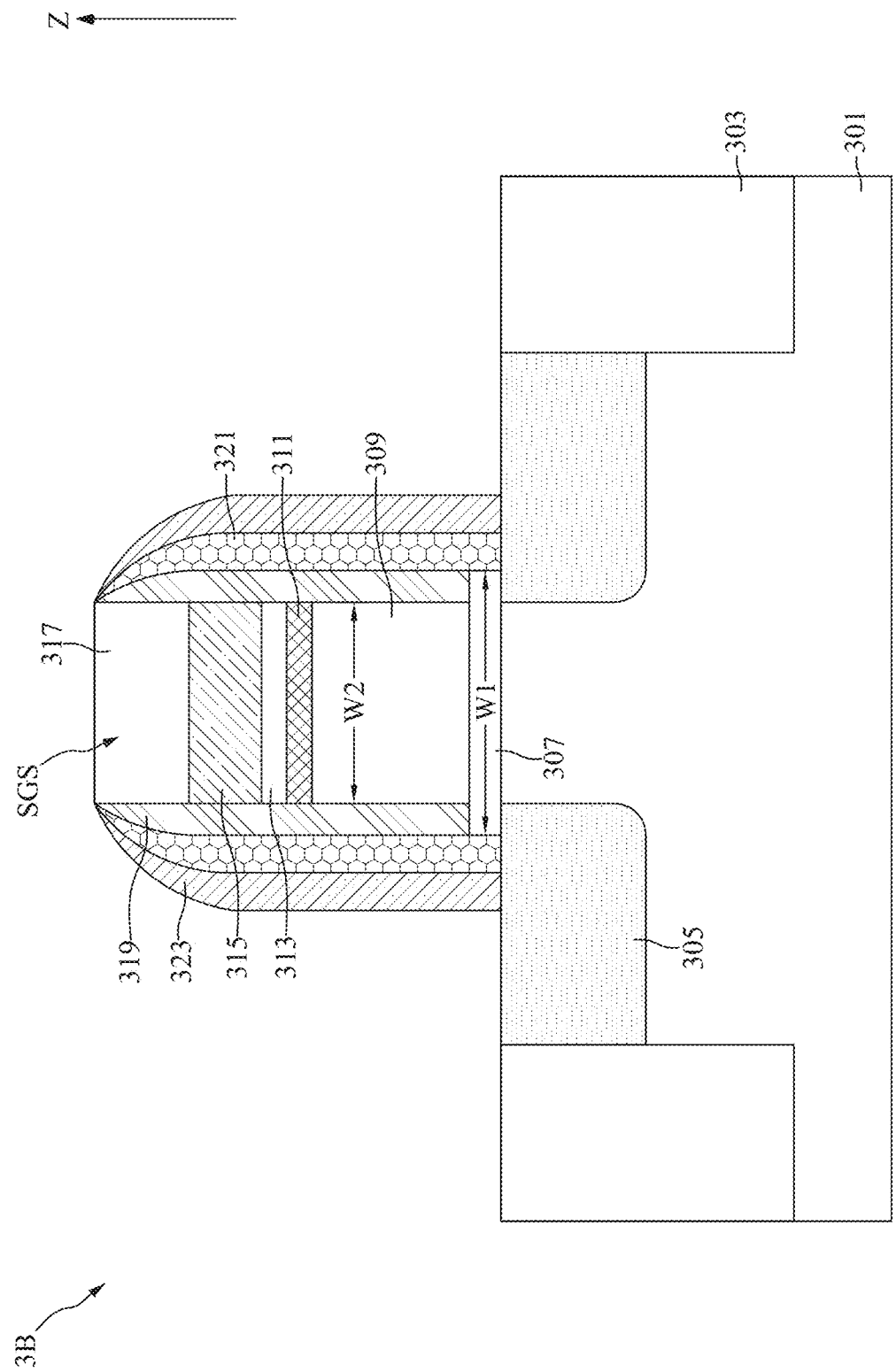
Figure 3:
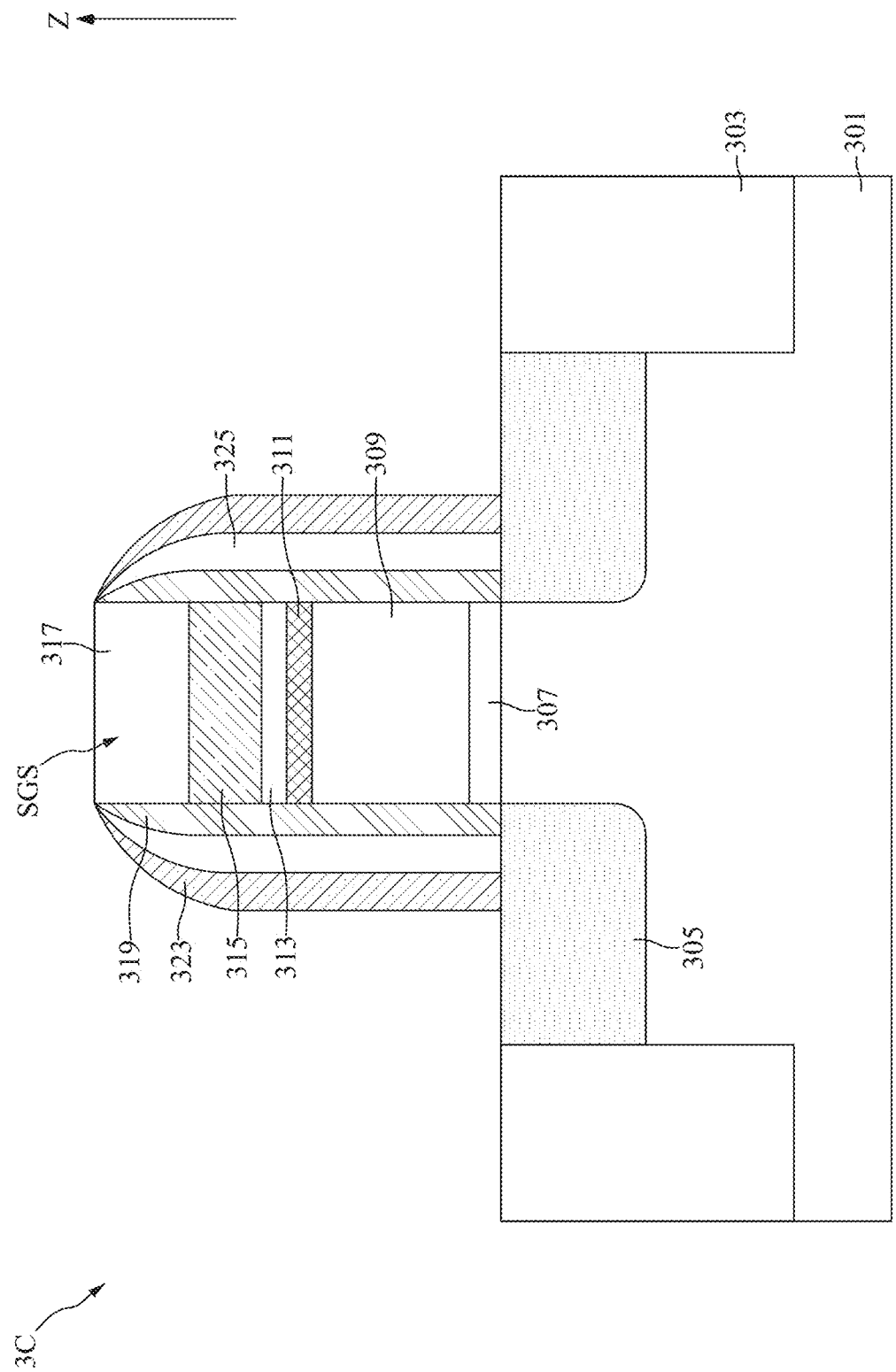
Figure 4:
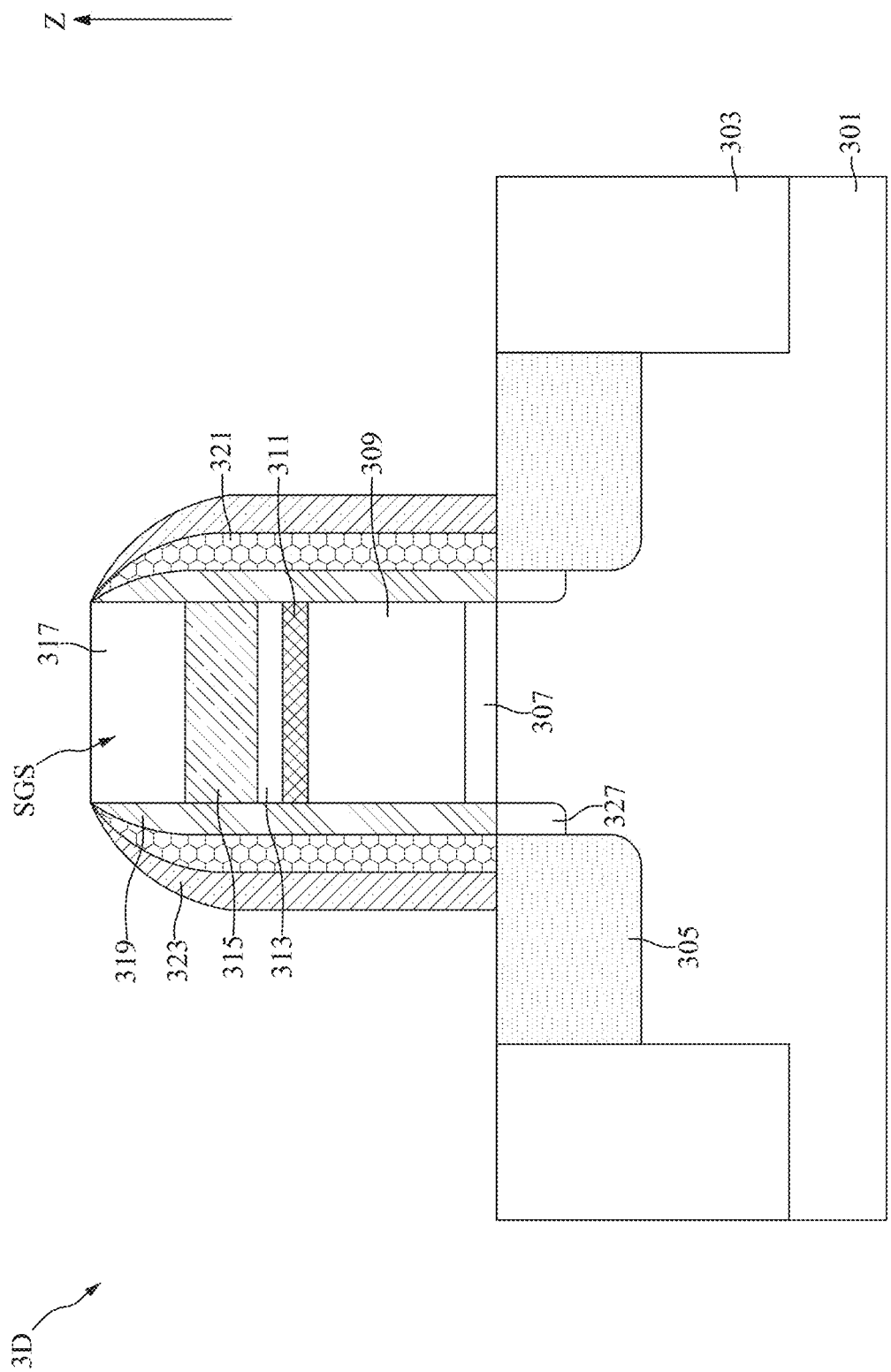

FIGS. 2 to 4 illustrate, in schematic cross-sectional view diagrams, semiconductor devices 3B, 3C, and 3D in accordance with some embodiments of the present disclosure.

With reference to FIG. 2, the semiconductor device 3B may have a structure similar to that illustrated in FIG. 1. The same or similar elements in FIG. 2 as in FIG. 1 have been marked with similar reference numbers and duplicative descriptions have been omitted.

With reference to FIG. 2, a width W1 of the dielectric layer 307 may be greater than a width W2 of the bottom conductive layer 309. The first spacers 319 may be disposed on the dielectric layer 307. The first spacers 319 may be electrically insulate from the second source/drain regions 305 by the dielectric layer 307.

With reference to FIG. 3, the semiconductor device 3C may have a structure similar to that illustrated in FIG. 1. The same or similar elements in FIG. 3 as in FIG. 1 have been marked with similar reference numbers and duplicative descriptions have been omitted.

With reference to FIG. 1 and FIG. 3, the porosities of the porous spacers 321 in FIG. 1 may be 100%, which means the porous spacers 321 includes only empty spaces. Consequently, the porous spacers 321 in FIG. 1 may be regarded as air gaps 325 in FIG. 3. The dielectric constant of the air gaps 325 are 1.0 which may significantly reduce the parasitic capacitance between the stacked gate structure SGS and horizontally neighboring conductive elements.

With reference to FIG. 4, the semiconductor device 3D may have a structure similar to that illustrated in FIG. 1. The same or similar elements in FIG. 4 as in FIG. 1 have been marked with similar reference numbers and duplicative descriptions have been omitted.

With reference to FIG. 4, the semiconductor device 3D may include lightly doped regions 327. The lightly doped regions 327 may be respectively correspondingly disposed adjacent to the two ends of the dielectric layer 307 and in the substrate 301. The first spacers 319 may be disposed on the lightly doped regions 327. The second source/drain regions 305 may be disposed adjacent to the lightly doped regions 327. The lightly doped regions 327 may be doped with a dopant such as phosphorus, arsenic, antimony, or boron. The dopant concentration of the lightly doped regions 327 may be less than the dopant concentration of the second source/drain regions 305. With the presence of the lightly doped regions 327, hot-carrier effect may be reduced.

Figure 5:
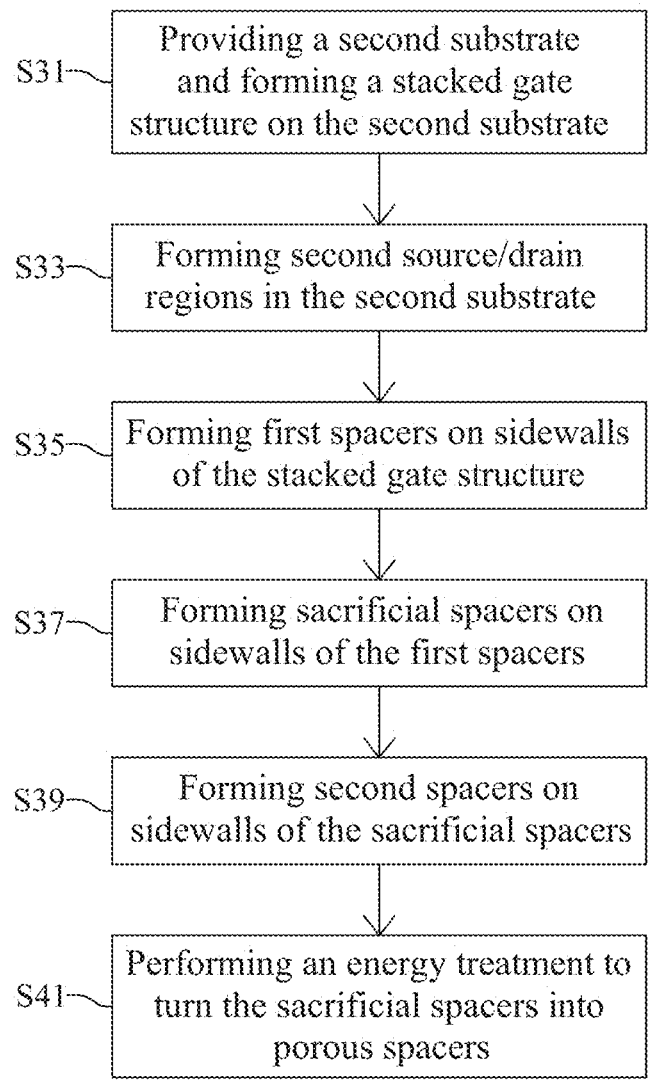
FIG. 5 illustrates, in a flowchart diagram form, a method for fabricating a semiconductor device in accordance with one embodiment of the present disclosure.

FIG. 5 illustrates, in a flowchart diagram form, a method 30 for fabricating a semiconductor device 3A in accordance with one embodiment of the present disclosure. FIGS. 6 to 15 illustrate, in schematic cross-sectional view diagrams, a flow for fabricating the semiconductor device 3A in accordance with one embodiment of the present disclosure.

With reference to FIG. 5 and FIGS. 6 to 9, at step S31, a substrate 301 may be provided and a stacked gate structure SGS may be formed on the substrate 301.

Figure 6:
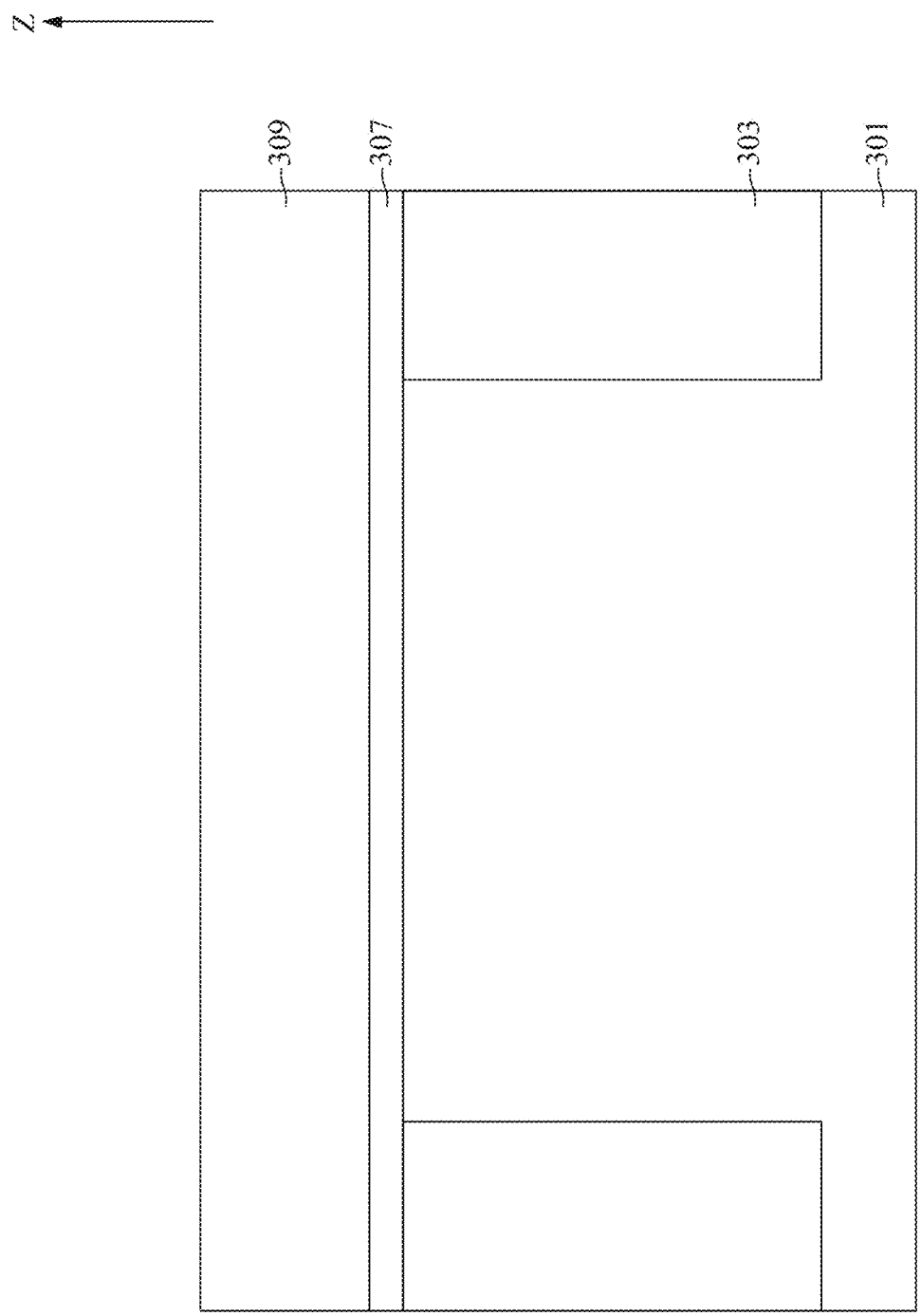
FIGS. 6 to 15 illustrate, in schematic cross-sectional view diagrams, a flow for fabricating the semiconductor device in accordance with one embodiment of the present disclosure.

With reference to FIG. 6, the second isolation layers 303 may be formed with a procedure similar to the first isolation layers 103 illustrated in FIG. 4. In some embodiments, the dielectric layer 307 may be formed on the substrate 301 by a deposition process such as chemical vapor deposition or atomic layer deposition. In some embodiments, the dielectric layer 307 may be formed by oxidation. The bottom conductive layer 309 may be formed on the dielectric layer 307 by chemical vapor deposition or other suitable deposition process.

Figure 7:
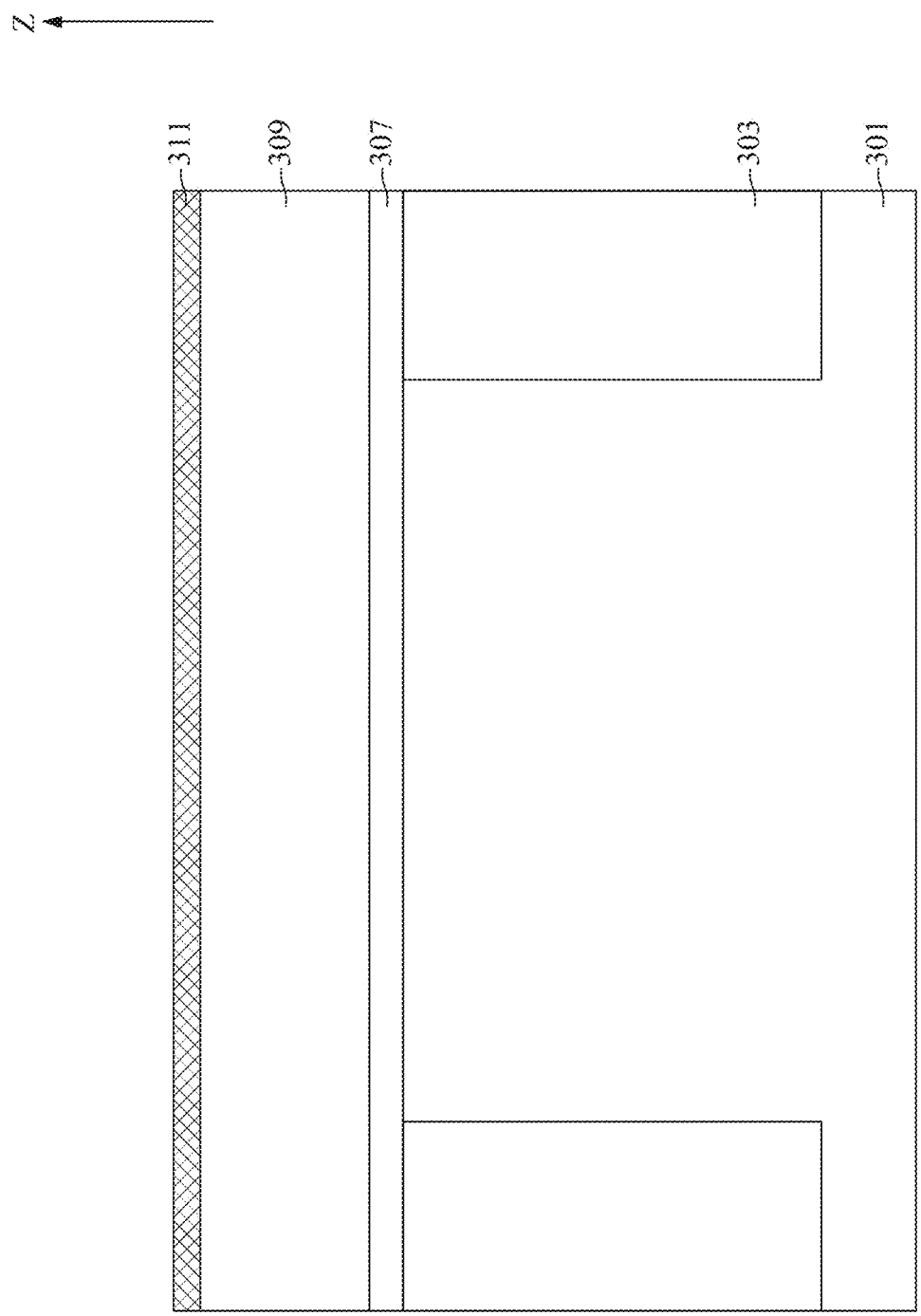

With reference to FIG. 7, a layer of conductive material may be formed over the intermediate semiconductor device illustrated in FIG. 6. The conductive material may include, for example, titanium, nickel, platinum, tantalum, or cobalt. A thermal treatment may be subsequently performed. During the thermal treatment, metal atoms of the layer of conductive material may react chemically with silicon atoms of the bottom conductive layer 309 to form the first middle conductive layer 311. The first middle conductive layer 311 may include titanium silicide, nickel silicide, nickel platinum silicide, tantalum silicide, or cobalt silicide. The thermal treatment may be a dynamic surface annealing process. After the thermal treatment, a cleaning process may be performed to remove the unreacted conductive material. The cleaning process may use etchant such as hydrogen peroxide and an SC-1 solution.

Figure 8:
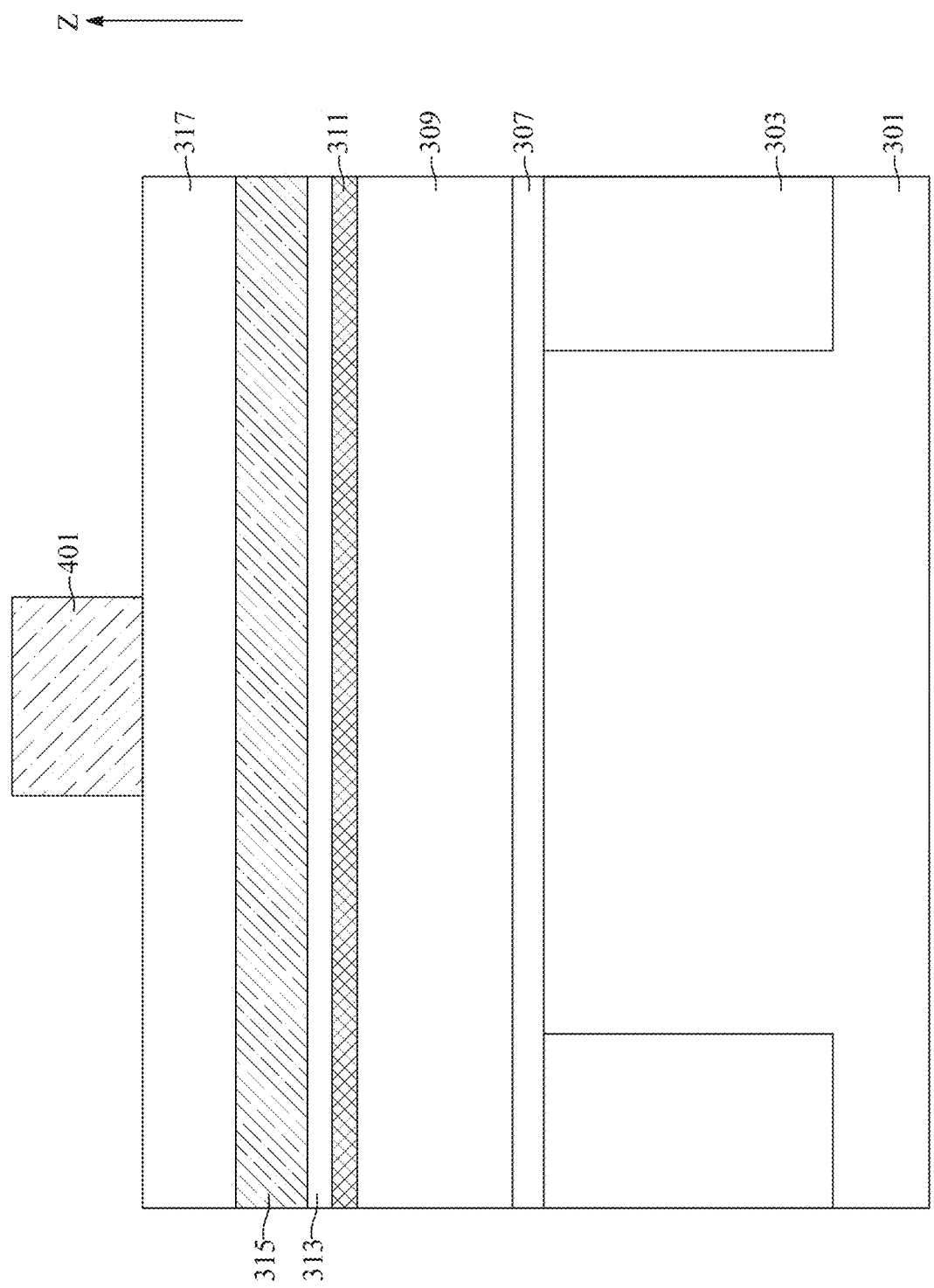

With reference to FIG. 8, a series of deposition processes may be performed to sequentially deposit the second middle conductive layer 313, the top conductive layer 315, the capping layer 317, and the first mask layer 401. The series of deposition processes may include chemical vapor deposition, plasma enhanced chemical vapor deposition, atomic layer deposition, physical vapor deposition, sputtering, or spin coating. The first mask layer 401 may be patterned to define the position of the stacked gate structure SGS.

Figure 9:
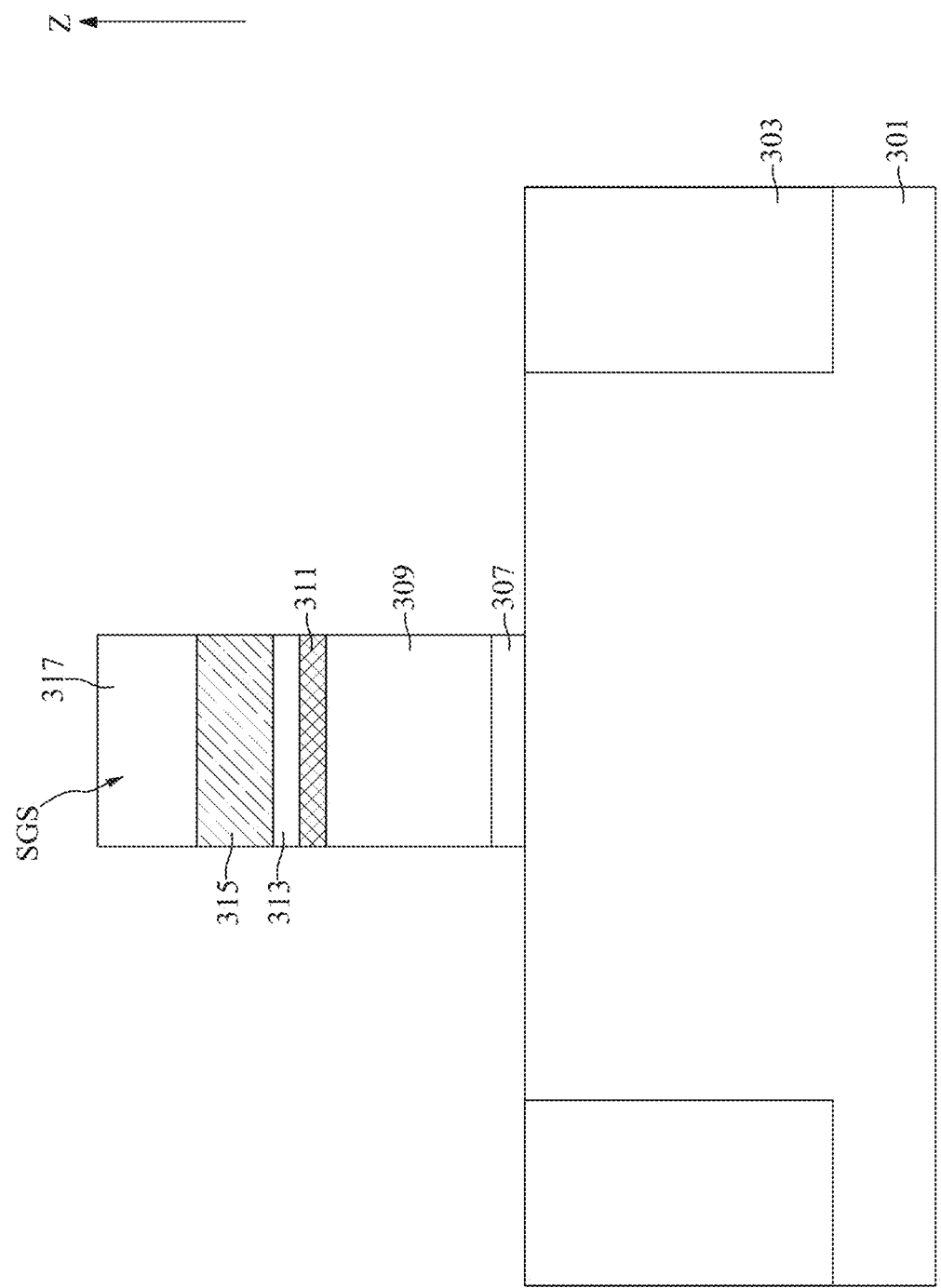

With reference to FIG. 9, an etch process may be performed to remove portions of the capping layer 317, the top conductive layer 315, the second middle conductive layer 313, the first middle conductive layer 311, the bottom conductive layer 309, and the dielectric layer 307. The remained portion of the capping layer 317, the top conductive layer 315, the second middle conductive layer 313, the first middle conductive layer 311, the bottom conductive layer 309, and the dielectric layer 307 together form the stacked gate structure SGS.

Figure 10:
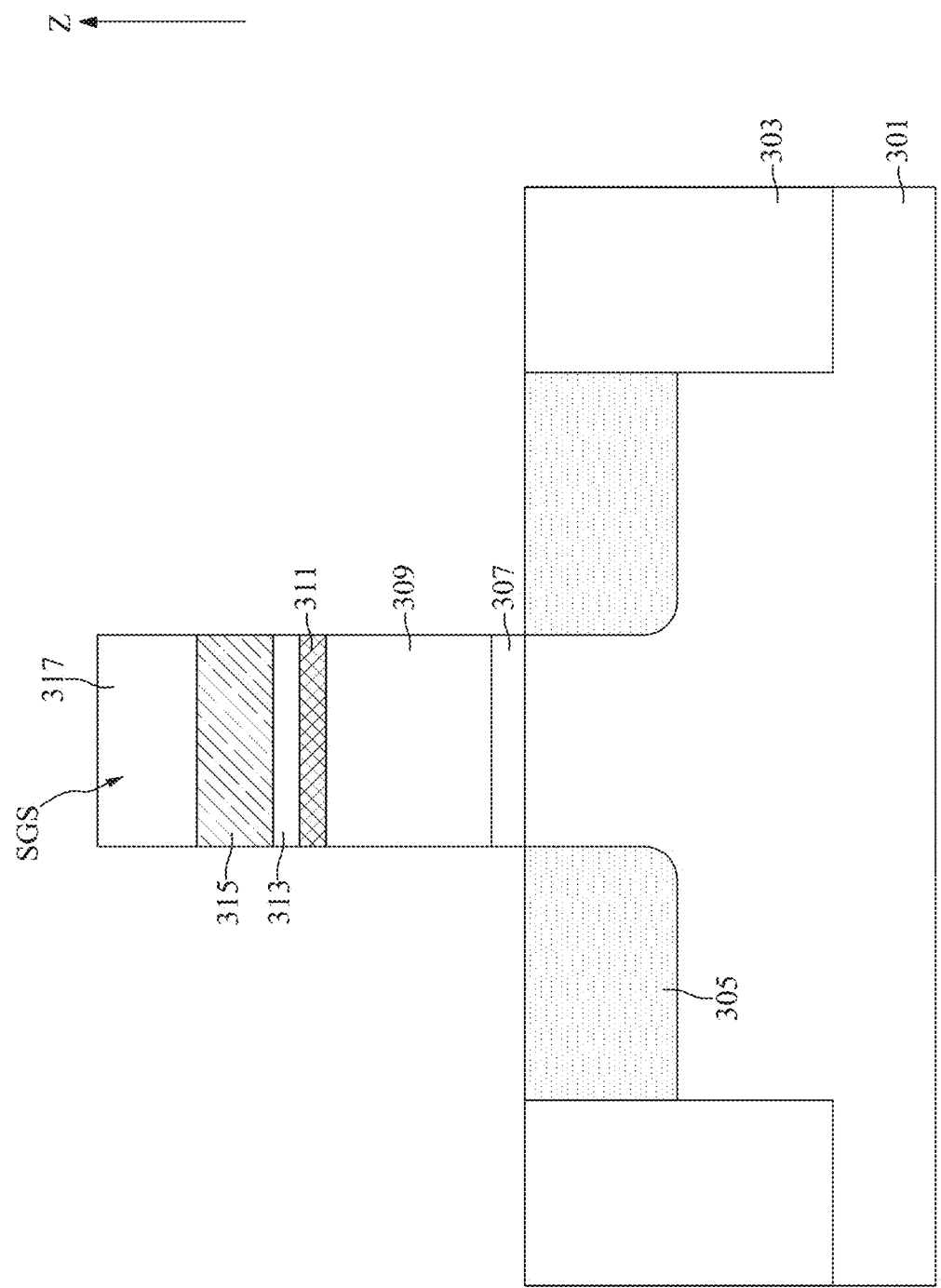

With reference to FIGS. 5 and 10, at step S33, second source/drain regions 305 may be formed in the substrate 301.

With reference to FIG. 10, the second source/drain regions 305 may be formed adjacent to the stacked gate structure SGS and in the substrate 301. The second source/drain regions 305 may be formed by a procedure similar to the first source/drain regions 105 illustrated in FIG. 4. An annealing process may be performed to activate the second source/drain regions 305. The annealing process may have a process temperature about 800° C. and about 1250° C. The annealing process may have a process duration about 1 millisecond and about 500 milliseconds. The annealing process may be, for example, a rapid thermal anneal, a laser spike anneal, or a flash lamp anneal.

Figure 11:
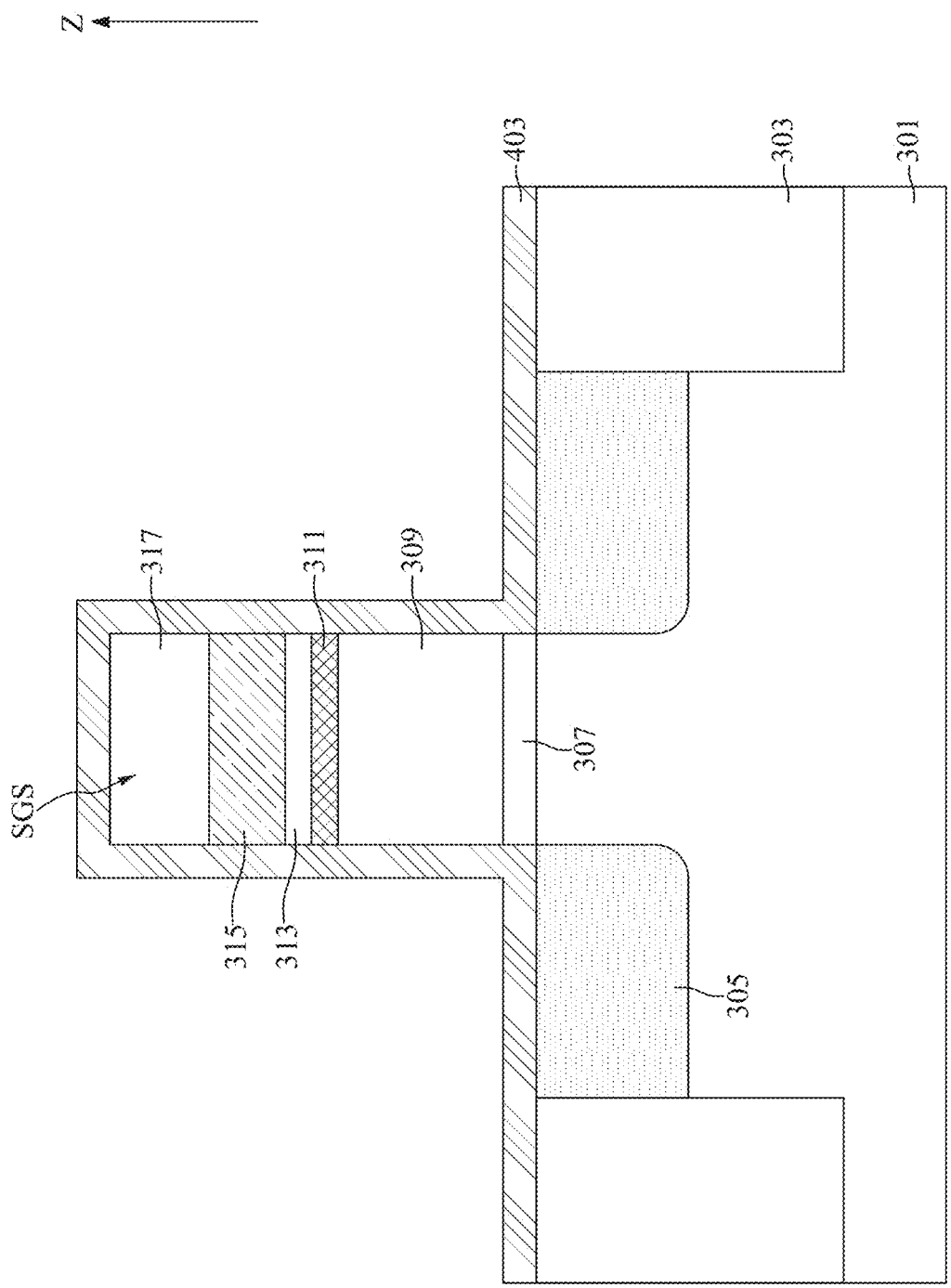
Figure 12:
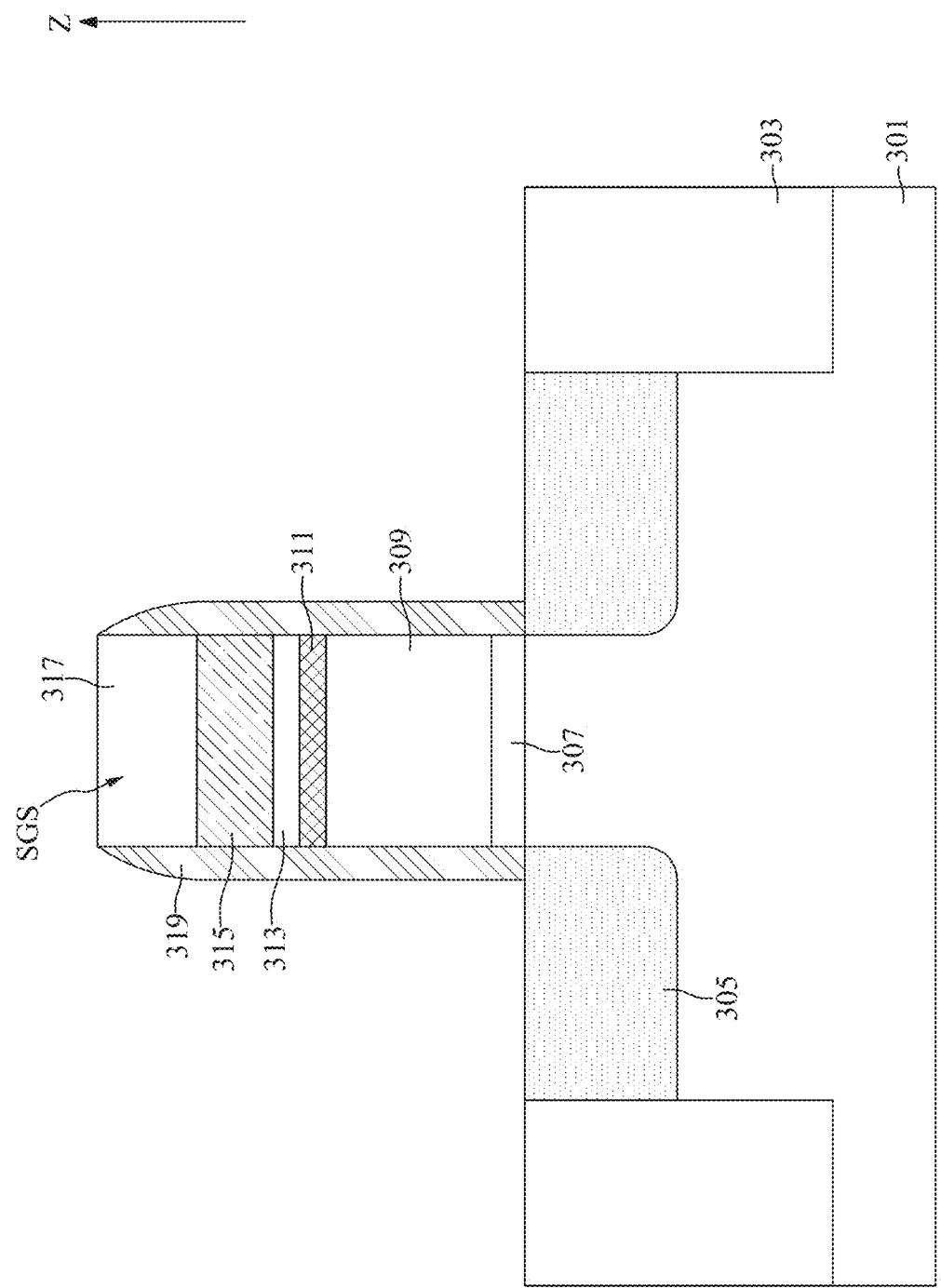

With reference to FIGS. 5, 11, and 12, at step S35, first spacers 319 may be formed on sidewalls of the stacked gate structure SGS.

With reference to FIG. 11, a liner layer 403 such as a layer of first conductive material may be formed to cover the top surface of the substrate 301 and the stacked gate structure SGS. In some embodiments, the layer of first conductive material may be formed including, for example, graphene. In some embodiments, the layer of first conductive material may be formed including, for example, graphene, graphite, or the like. In some embodiments, the layer of first conductive material may be formed including, for example, a material including $sp^2$ hybridized carbon atoms. In some embodiments, the layer of first conductive material may be formed including, for example, a material including carbons having hexagonal crystal structures.

In some embodiments, the layer of first conductive material may be formed on a catalyst substrate and then transfer onto the intermediate semiconductor device illustrated in FIG. 10. The catalyst substrate may include nickel, copper, cobalt, platinum, silver, ruthenium, iridium, palladium, alloy of iron and nickel, alloy of copper and nickel, alloy of nickel and molybdenum, alloy of gold and nickel, and alloy of cobalt and copper.

In some embodiments, the layer of first conductive material may be formed with assistances of catalysts. The catalysts may be single crystalline metal or polycrystalline metal, binary alloy, or liquid metal. The single crystalline metal or polycrystalline metal may be, for example, nickel, copper, cobalt, platinum, silver, ruthenium, iridium, or palladium. The binary alloy may be, for example, alloy of iron and nickel, alloy of copper and nickel, alloy of nickel and molybdenum, alloy of gold and nickel, and alloy of cobalt and copper. The liquid metal may be, for example, liquid gallium, liquid indium, or liquid copper.

With reference to FIG. 12, an etch process, spacer etching, such as an anisotropic dry etch process, may be performed to remove portions of the layer of first conductive material and concurrently form the first spacers 319.

Figure 13:
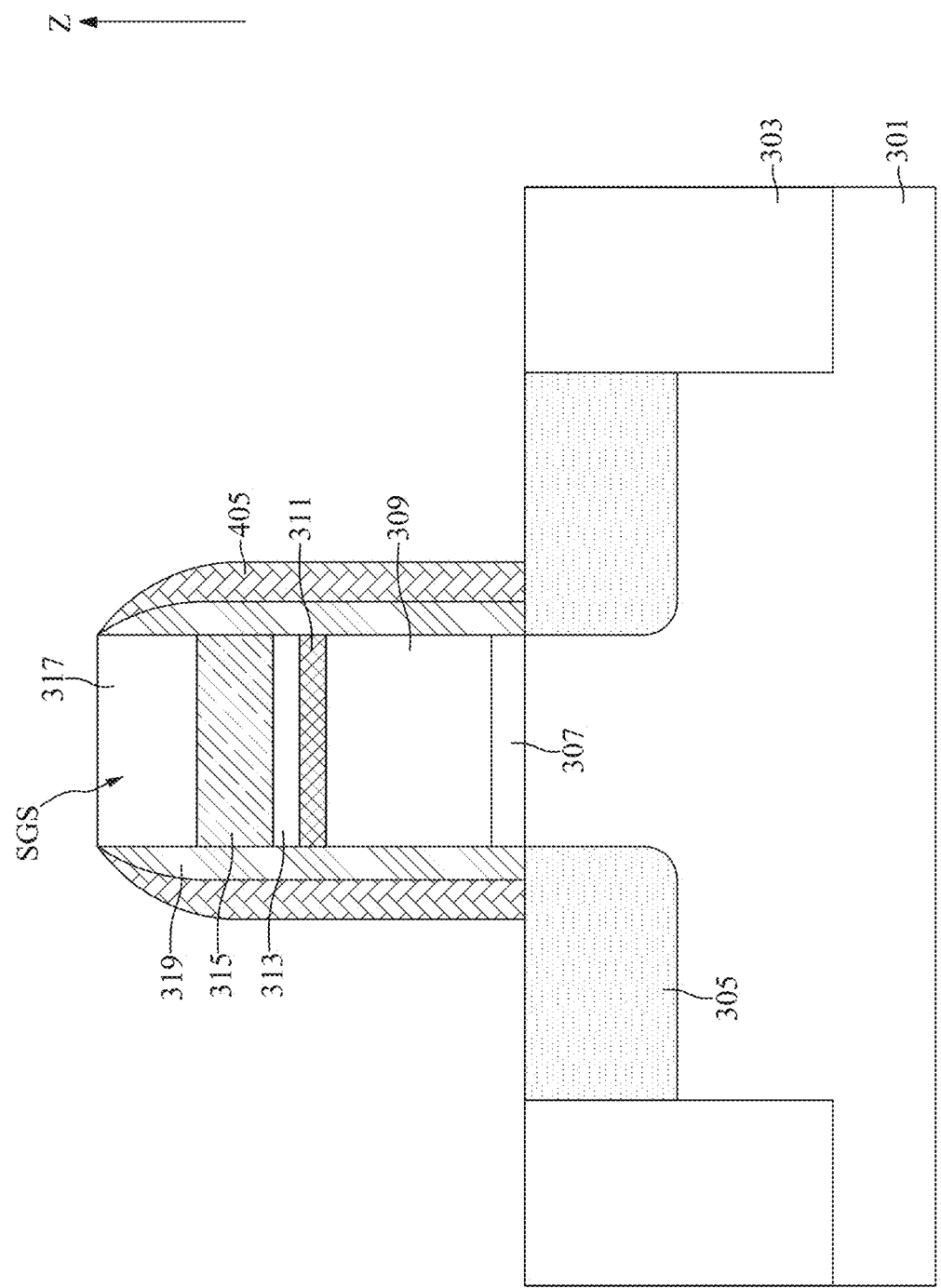

With reference to FIGS. 5 and 13, at step S37, sacrificial spacers 405 may be formed on sidewalls of the first spacers 319.

With reference to FIG. 13, a layer of energy-removable material may be formed over the intermediate semiconductor device illustrated in FIG. 12. The energy-removable material may include a material such as a thermal decomposable material, a photonic decomposable material, an e-beam decomposable material, or a combination thereof. For example, the energy-removable material may include a base material and a decomposable porogen material that is sacrificially removed upon exposure to an energy source. The base material may include a methylsilsesquioxane based material. The decomposable porogen material may include a porogen organic compound that provides porosity to the base material of the energy-removable material. An etch process, such as an anisotropic dry etch process, may be subsequently performed to remove portions of the layer of energy-removable material and concurrently form the sacrificial spacers 405.

Figure 14:
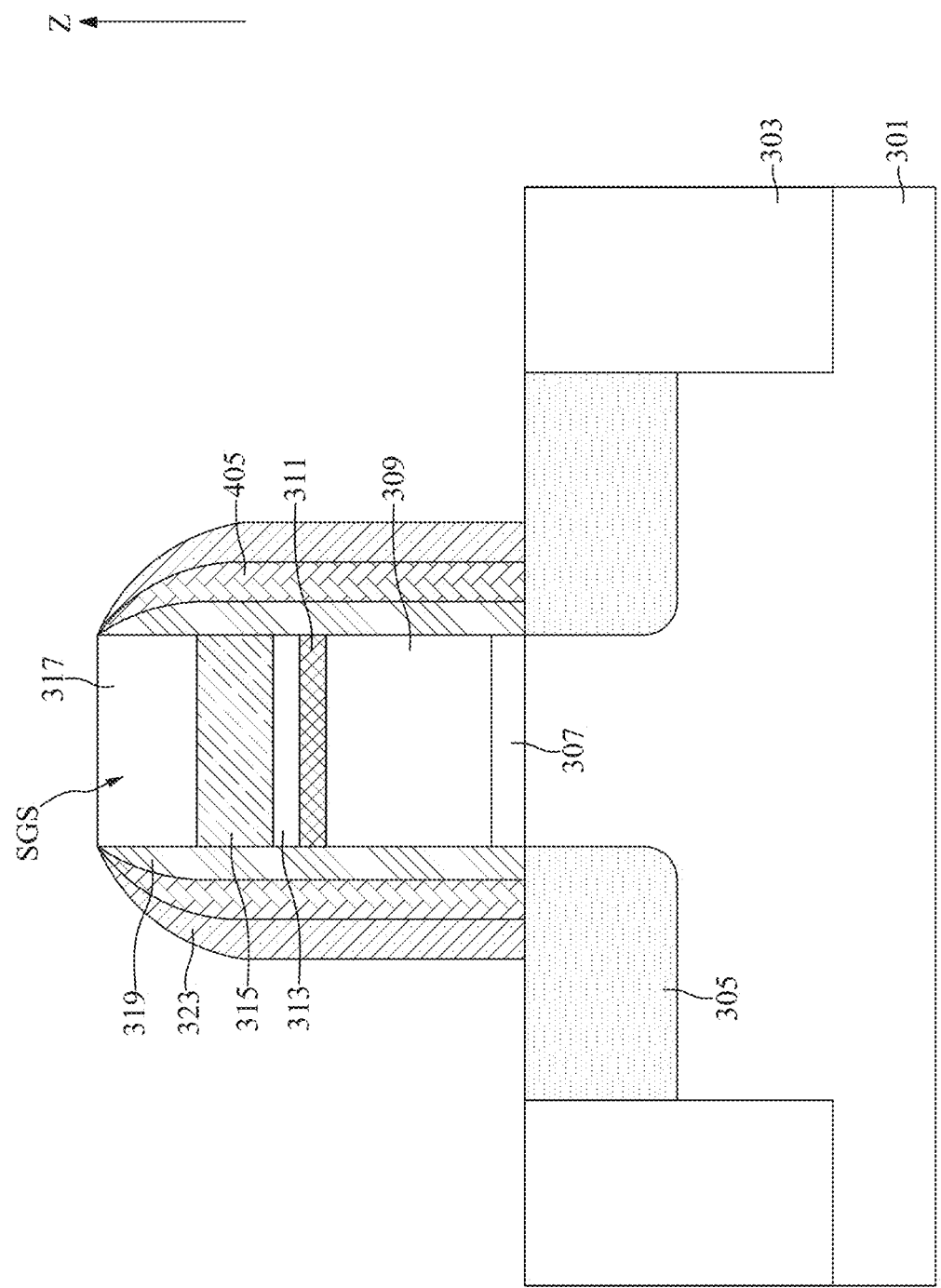

With reference to FIGS. 5 and 14, at step S39, second spacers 323 may be formed on sidewalls of the sacrificial spacers 405.

With reference to FIG. 14, a layer of insulating material may be formed over the intermediate semiconductor device illustrated in FIG. 13. The insulating material may be, for example, silicon nitride, silicon oxide, silicon oxynitride, silicon nitride oxide, the like, or a combination thereof. An etch process, such as an anisotropic dry etch process, may be subsequently performed to remove portions of the layer of insulating material and concurrently form the second spacers 323.

Figure 15:
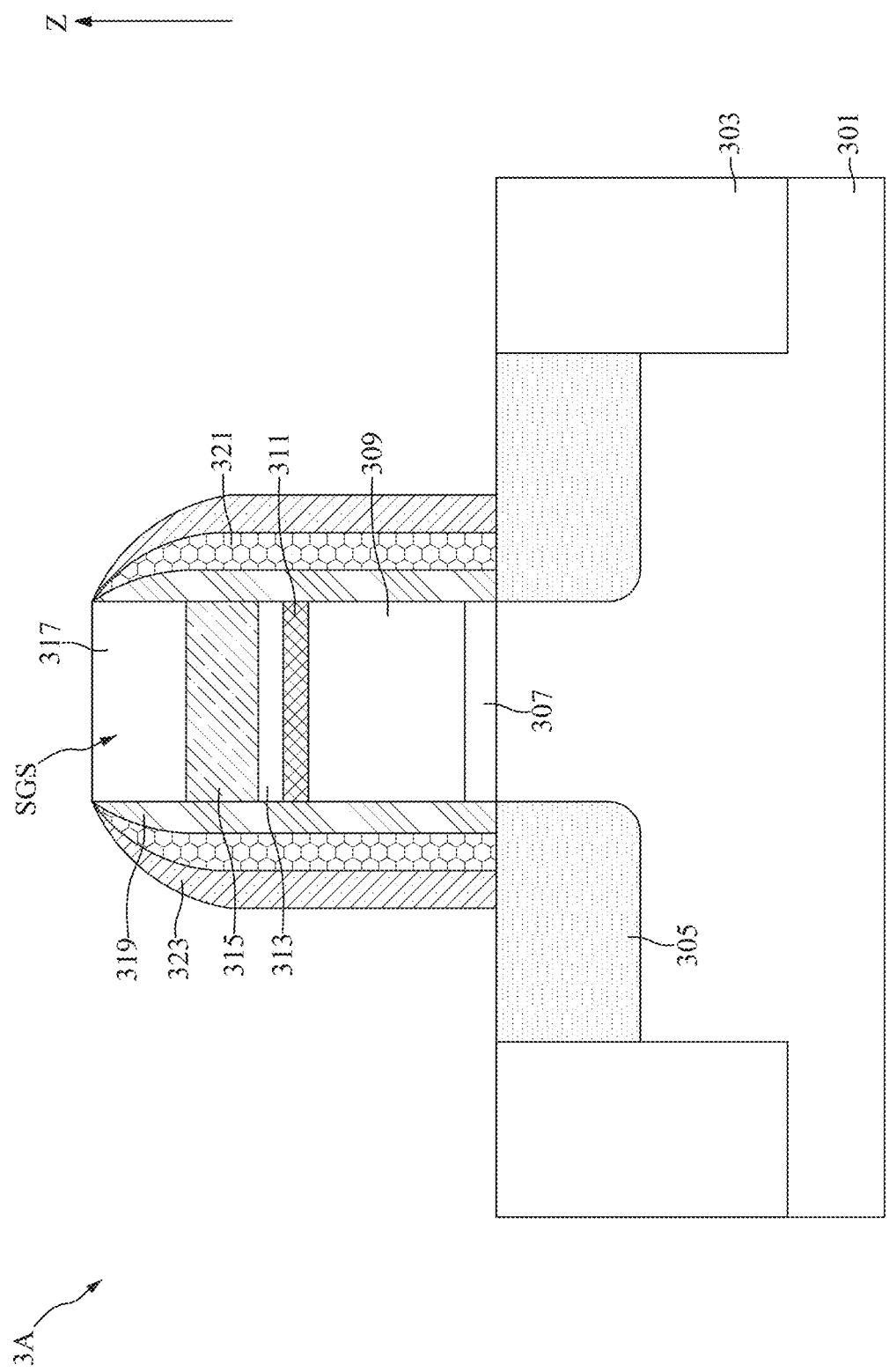

With reference to FIGS. 5 and 15, at step S41, an energy treatment may be performed to turn the sacrificial spacers 405 into porous spacers 321.

With reference to FIG. 15, an energy treatment may be performed to the intermediate semiconductor device illustrated in FIG. 14 by applying an energy source thereto. The energy source may include heat, light, or a combination thereof. When heat is used as the energy source, a temperature of the energy treatment may be about 800° C. and about 900° C. When light is used as the energy source, an ultraviolet light may be applied. The energy treatment may remove the decomposable porogen material from the energy-removable material to generate empty spaces (pores), with the base material remaining in place. After the energy treatment, the sacrificial spacers 405 may be turned into the porous spacers 321.

One aspect of the present disclosure provides a semiconductor device including a substrate, a buried dielectric layer inwardly positioned in the substrate, a buried conductive layer including a lower portion positioned on the buried dielectric layer and an upper portion positioned on the lower portion, a buried capping layer positioned on the upper portion, and buried covering layers positioned between the buried capping layer and the buried dielectric layer and between the upper portion of the buried conductive layer and the buried dielectric layer. The buried conductive layer includes graphene.

Due to the design of the semiconductor device of the present disclosure, the overall cross-sectional area of the buried conductive layer 113 may be increased by the upper portion 113-3 of the buried conductive layer 113. Combining with the good conductivity of the buried conductive layer 113 including graphene, the conductivity and performance of the semiconductor device 1A may be improved. In addition, the presence of the buried covering layers 111 may prevent void formation during fabrication of the semiconductor device 1A. Therefore, the reliability of the semiconductor device 1A may be improved.

One aspect of the present disclosure provides a semiconductor device including a substrate; a stacked gate structure positioned on the substrate; first spacers attached on two sides of the stacked gate structure; and second spacers attached on two sides of the first spacers; wherein the first spacers comprise graphene.

Another aspect of the present disclosure provides a method for fabricating a semiconductor device, comprising: providing a substrate; forming a stacked gate structure over the substrate; forming first spacers on sidewalls of the gate stack structure, wherein the first spacers comprise graphene; forming sacrificial spacers on sidewall of the first spacers; and forming second spacers on sidewall of the sacrificial spacers.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a stacked gate structure positioned on the substrate;
first spacers attached on two sides of the stacked gate structure;
second spacers attached on two sides of the first spacers; and
porous spacers positioned between the first spacers and the second spacers
wherein the first spacers comprise graphene, wherein the stacked gate structure comprises a dielectric layer positioned on the substrate, a bottom conductive layer positioned on the dielectric layer, and a top conductive layer positioned on the bottom conductive layer, wherein the top conductive layer is a metal conductive layer formed of tungsten, aluminum, copper, titanium, silver, ruthenium, molybdenum, or alloys thereof, wherein a width of the dielectric layer is greater than a width of the bottom conductive layer, and the first spacer is disposed on the dielectric layer; and
wherein the stacked gate structure further comprises a first middle conductive layer positioned between the bottom conductive layer and the top conductive layer, and a second middle conductive layer positioned between the first middle conductive layer and the top conductive layer, wherein a thickness of the first middle conductive layer is about 2 nm and about 20 nm; wherein the porous spacers have porosities about 30% and about 90%.

2. The semiconductor device of claim 1, wherein the stacked gate structure comprises a capping layer positioned on the top conductive layer.

3. The semiconductor device of claim 1, further comprising air gap spacers positioned between the first spacers and the second spacers.

\* \* \* \* \*